United States Patent [19]

Fiorina et al.

[11] Patent Number: 5,432,452
[45] Date of Patent: Jul. 11, 1995

[54] DEVICE FOR DETECTING FAILURE OF BATTERY CELLS BY COMPARING THE SECOND DERIVATIVE OF BATTERY VOLTAGE OVERTIME WITH A PRESET THRESHOLD

[75] Inventors: Jean-Noël Fiorina, Seyssinet-Pariset; Patrick Lailler, Clichy, both of France

[73] Assignee: Merlin Gerin, France

[21] Appl. No.: 91,916

[22] Filed: Jul. 16, 1993

[30] Foreign Application Priority Data

Aug. 5, 1992 [FR] France ................... 92 09819

[51] Int. Cl.⁶ ............... G01N 27/416; H02J 7/04
[52] U.S. Cl. .................... 324/427; 324/426; 320/48; 340/636
[58] Field of Search .............. 324/426, 427, 429, 433; 340/636; 320/21, 31, 39, 48; 429/197

[56] References Cited

U.S. PATENT DOCUMENTS

| | | | |
|---|---|---|---|
| 4,322,685 | 3/1982 | Frailing et al. | 324/429 |
| 5,027,294 | 6/1991 | Fakruddin et al. | 324/426 X |
| 5,061,898 | 10/1991 | Oram et al. | 324/427 |
| 5,166,623 | 11/1992 | Ganio | 324/472 |
| 5,278,509 | 1/1994 | Haynes et al. | 324/427 |

FOREIGN PATENT DOCUMENTS 2591822 6/1987 France .

*Primary Examiner*—Kenneth A. Wieder
*Assistant Examiner*—Diep Do
*Attorney, Agent, or Firm*—Parkhurst, Wendel & Rossi

[57] ABSTRACT

Failure of one or more battery cells, for example of an inverter battery bank, is detected by monitoring the second derivative of the curve U(t) representative of the voltage U at the terminals of the battery in the course of discharge. If the second derivative is positive, this is significant of a failure.

7 Claims, 5 Drawing Sheets

DEVICE FOR DETECTING FAILURE OF BATTERY CELLS BY COMPARING THE SECOND DERIVATIVE OF BATTERY VOLTAGE OVERTIME WITH A PRESET THRESHOLD

BACKGROUND OF THE INVENTION

The invention relates to a device for detecting failure of battery cells.

Storage batteries, notably those used in Uninterruptible Power Supplies, are generally made up of a number of cells Connected in series. Up to now detection of failure of one or more battery cells has only been able to be performed by monitoring the individual voltage at the terminals of each cell. This involves measuring a large number of voltages and requires the terminals of the different cells to be accessible.

The object of the invention is to achieve a device for detecting failure of one or more battery cells which is simpler and does not present the above-mentioned drawbacks.

SUMMARY OF THE INVENTION

According to the invention, this object is achieved by the fact that the device comprises means for measuring the voltage at terminals of the battery, when the battery is discharging, means for computing a quantity representative of the second derivative of said voltage, means for comparing said quantity representative of the second derivative with a preset, positive or nil, threshold, and means for indicating a failure when said quantity is greater than said threshold.

According to a preferred embodiment, the device stores three successive values of the voltage at the terminals of the battery, measured at preset time intervals, and computes from these three values two successive values of a quantity representative of the first derivative of the voltage. It then computes the quantity representative of the second derivative by computing the difference between the two successive values of the quantity representative of the first derivative.

BRIEF DESCRIPTION OF THE DRAWINGS

Other advantages and features will become more clearly apparent from the following description of an illustrative embodiment of the invention, given as a non-restrictive example only and represented in the accompanying drawings in which.

DESCRIPTION OF THE PREFERRED EMBODIMENT

Figure 1:
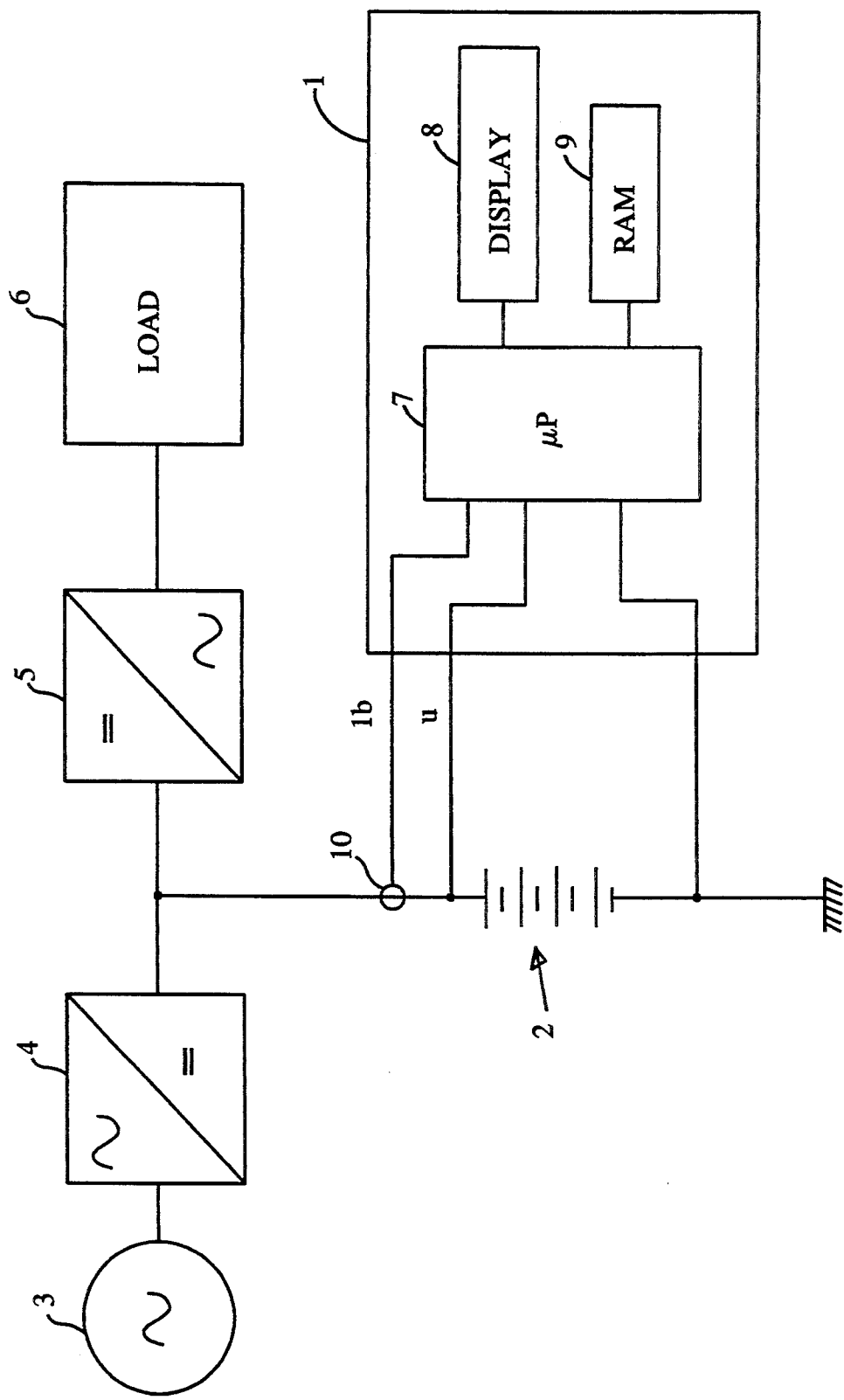
FIG. 1 represents, in block diagram form, an installation comprising a device according to the invention.

FIG. 1 illustrates the application of a device 1 for detecting failure of one or more battery cells to a battery 2 of a UPS. The UPS, of conventional type, represented schematically in the figure, is supplied by an AC voltage source 3 and comprises an AC-DC converter 4 serially connected with a DC-AC converter, or inverter 5, and a load 6, the battery 2 being connected to the output of the converter 4.

The device 1 comprises an electronic processing circuit 7, with microprocessor, connected to a display device 8. The electronic processing circuit 7 receives on input signals representative of the voltage U at the terminals of the battery.

A failure of one or more battery cells results, when the battery is discharging, in a break in the slope of the curve U(t) representative of the voltage U versus time. Such a break in the slope can be detected by computing the second derivative of the curve U(t). In normal operation, the second derivative of the voltage is always negative when the battery is in the course of discharging. If the second derivative becomes positive in the course of discharging, this is representative of failure of one or more cells of the battery.

Figure 2:
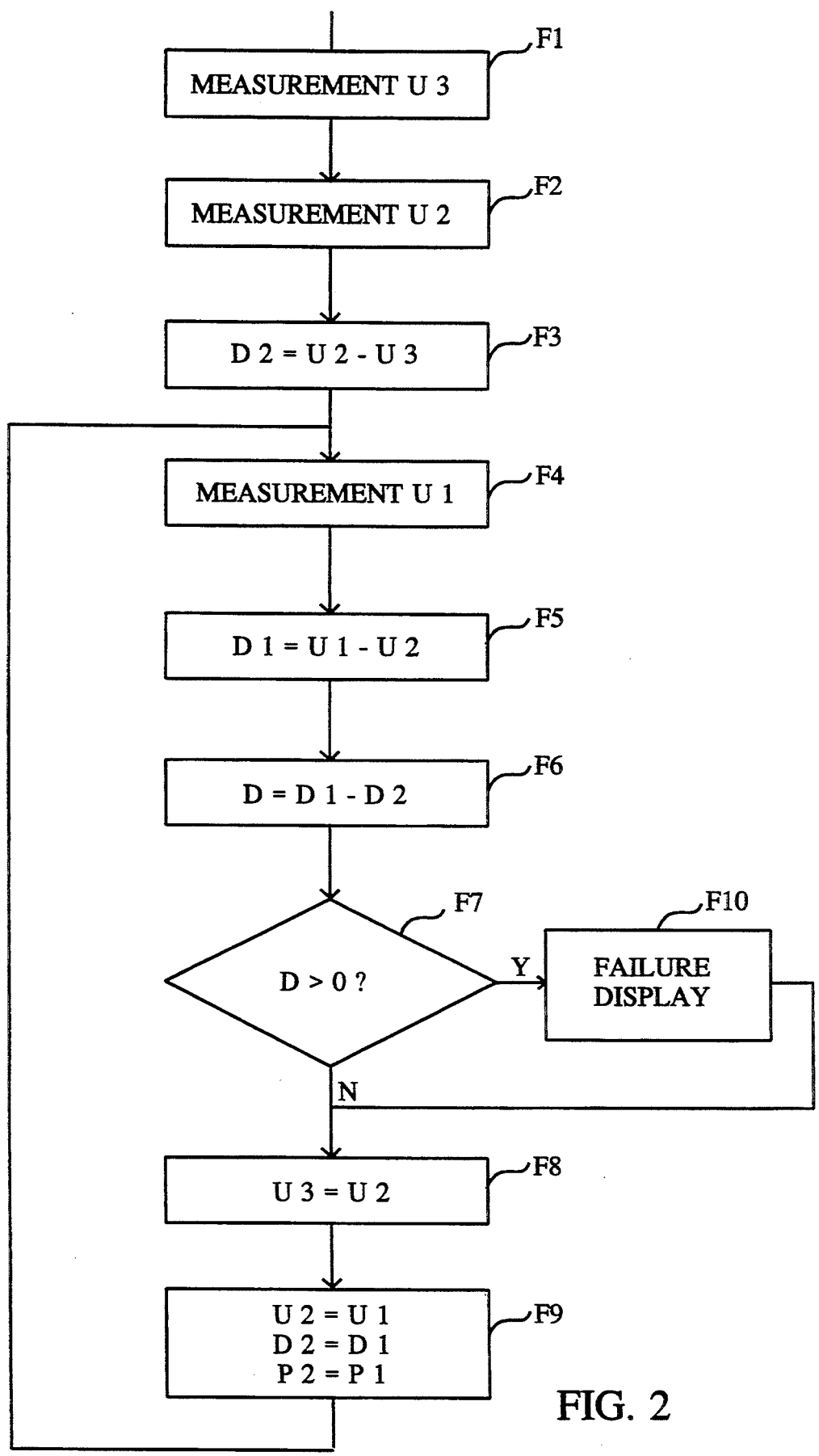
FIG. 2 represents a particular embodiment of a flow chart for implementation of the invention.

FIG. 2 illustrates a preferred embodiment of a flow chart which can be implemented by the microprocessor 7. In FIG. 2, detection of failure begins by a phase F1 in which a first measurement U3 is made by the microprocessor 7 of the voltage U at the terminals of the battery 2. This phase F1 is followed by a phase F2 consisting of a second measurement U2 of the voltage U at the terminals of the battery after a preset time interval $\Delta t$. Then the microprocessor computes (F3) the difference D2 between U2 and U3. The time interval $\Delta t$ between two successive measurements being preset and constant, the difference D2 is representative of the derivative of the curve U(t).

The microprocessor then makes (F4) a third measurement U1 of the voltage U at the terminals of the battery 2, the time interval $\Delta t$ separating the measurements of U1 and U2. Then it computes (F5) the difference D1 between U1 and U2 and (F6) the difference D between D1 and D2. The difference D is representative of the second derivative of the curve U(t) constituted from the three successive measurements U3, U2 and U1 of U made at constant preset time intervals $\Delta t$ and stored, for example in a RAM 9. Then D is compared with a threshold, preferably zero, during a phase F7.

If D is lower than the threshold (output N of F7), the battery cells are considered to be in good working order. The second measurement U2 replaces (F8) the value U3 in the memory 9 of the processing circuit 7. Then (F9) the first measurement U1 replaces the value U2 in the memory 9 and the difference D1 replaces the difference D2. Thus, the last two measurements are stored, along with their difference, and the microprocessor can restart a new cycle to determine the second derivative D at F4, by a new measurement of U1, the time interval $\Delta t$ separating two successive measurements. As a non-restrictive example only, $\Delta t$ can be about 20 or 30s.

If this way, the second derivative is computed automatically at each new measurement U1.

If D is greater than the threshold (output Y of F7), a failure is indicated for example (F10) by display on the display means 8.

Indication can naturally be achieved by any other suitable means, either visual or acoustic, locally or remotely.

In the embodiment represented in FIG. 2, the threshold representative of a failure is zero. To avoid certain spurious alarms it may be preferable to choose a threshold slightly greater than zero.

Figure 3:
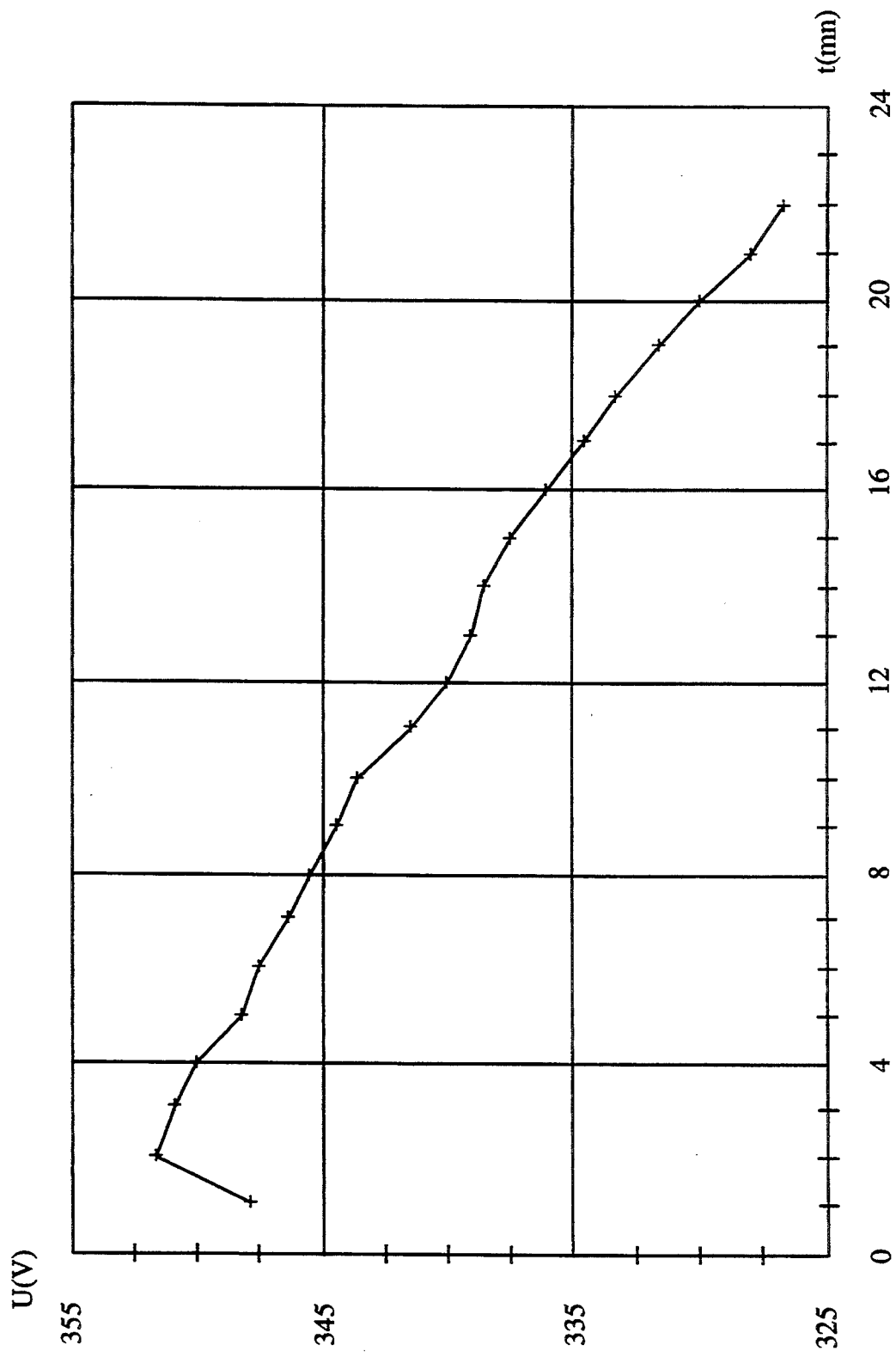
FIGS. 3 and 4 represent respectively the variation curves, versus time, of the voltage at the terminals of the battery and of the voltages measured at the terminals of some of its cells.

It can be shown experimentally that the second derivative D is well representative of a failure. As an example, FIG. 3 represents a discharge curve U(t) obtained experimentally at the terminals of an inverter battery made up of 29 cell units.

The successive values of U, measured with a time interval $\Delta t$ of 1 minute, and the successive computed values of D1 and D are as shown below.

| t (min) | U (V)    | D1   | D    |
|---------|----------|------|------|
| 1       | 347.7665 |      |      |
| 2       | 351.5218 | 3.8  |      |
| 3       | 350.925  | −0.6 | −4.4 |
| 4       | 349.7962 | −1.1 | −0.5 |
| 5       | 348.2835 | −1.5 | −0.4 |
| 6       | 347.4759 | −0.8 | 0.7  |
| 7       | 346.4733 | −1.0 | −0.2 |
| 8       | 345.6198 | −0.9 | 0.1  |
| 9       | 344.5427 | −1.1 | −0.2 |
| 10      | 343.6921 | −0.9 | 0.2  |
| 11      | 341.6315 | −2.1 | −1.2 |
| 12      | 340.0479 | −1.6 | 0.5  |
| 13      | 339.2599 | −0.8 | 0.8  |
| 14      | 338.4148 | −0.8 | −0.1 |
| 15      | 337.4351 | −1.0 | −0.1 |
| 16      | 336.2036 | −1.2 | −0.3 |
| 17      | 334.727  | −1.5 | −0.2 |
| 18      | 333.2822 | −1.4 | 0.0  |
| 19      | 331.594  | −1.7 | −0.2 |
| 20      | 329.9797 | −1.6 | 0.1  |
| 21      | 328.1715 | −1.8 | −0.2 |
| 22      | 326.8366 | −1.3 | 0.5  |

Anomalies (D > 0) are observed at the following times: 6 - 8 - 10 - 12 - 13 - 18 and 20 mins.

Figure 4:
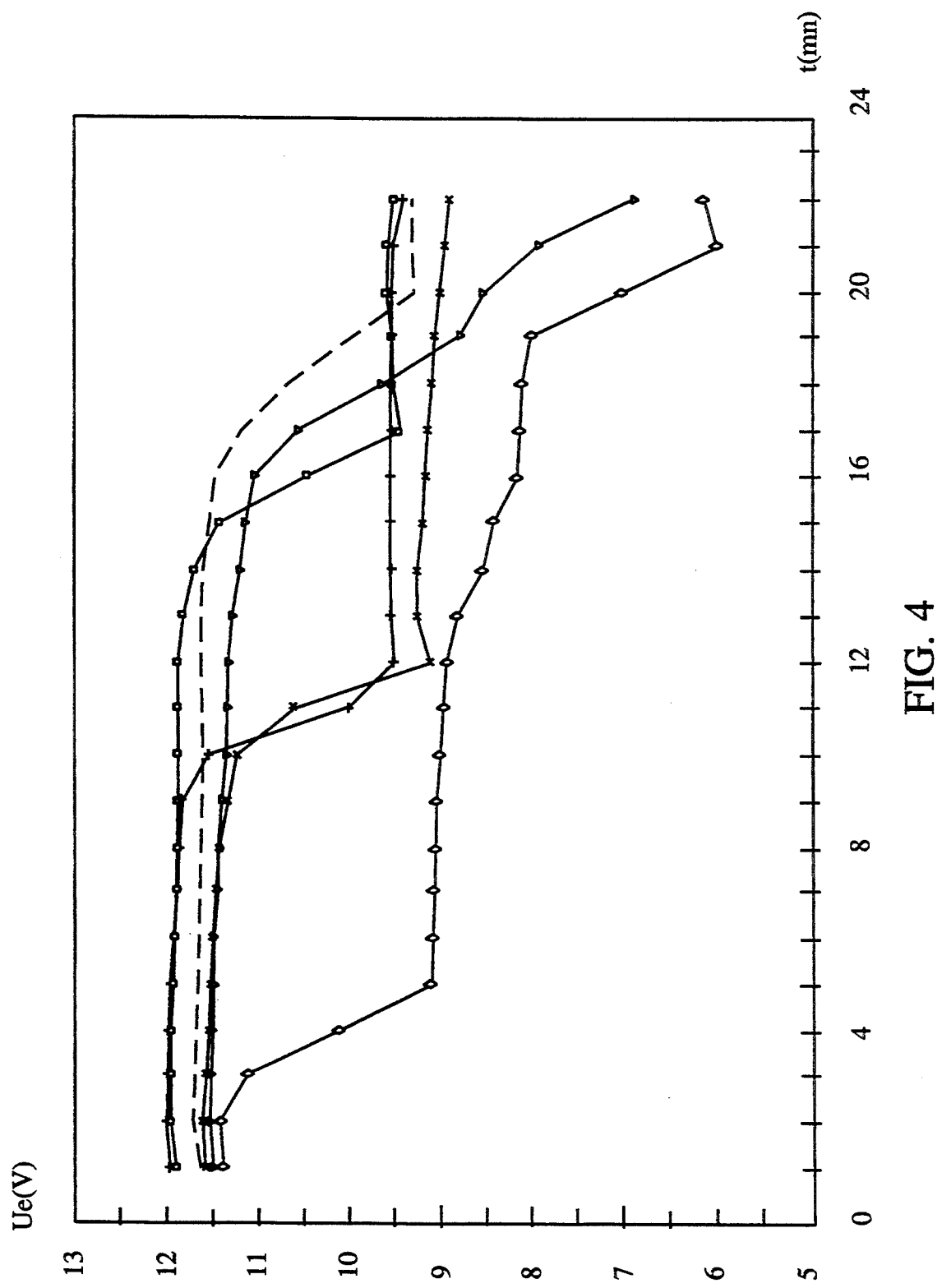

FIG. 4 represents the curves Ue(t) representing the variations in the voltages at the terminals of 5 cell units during this discharge. Significant voltage drops (Ue>10 V) can be observed on at least one of the cell units at the following times: 5-11-12-17-19 and 20 mins. The voltages at the terminals of the remaining cell units, not represented, did not present any significant drop.

Figure 5:
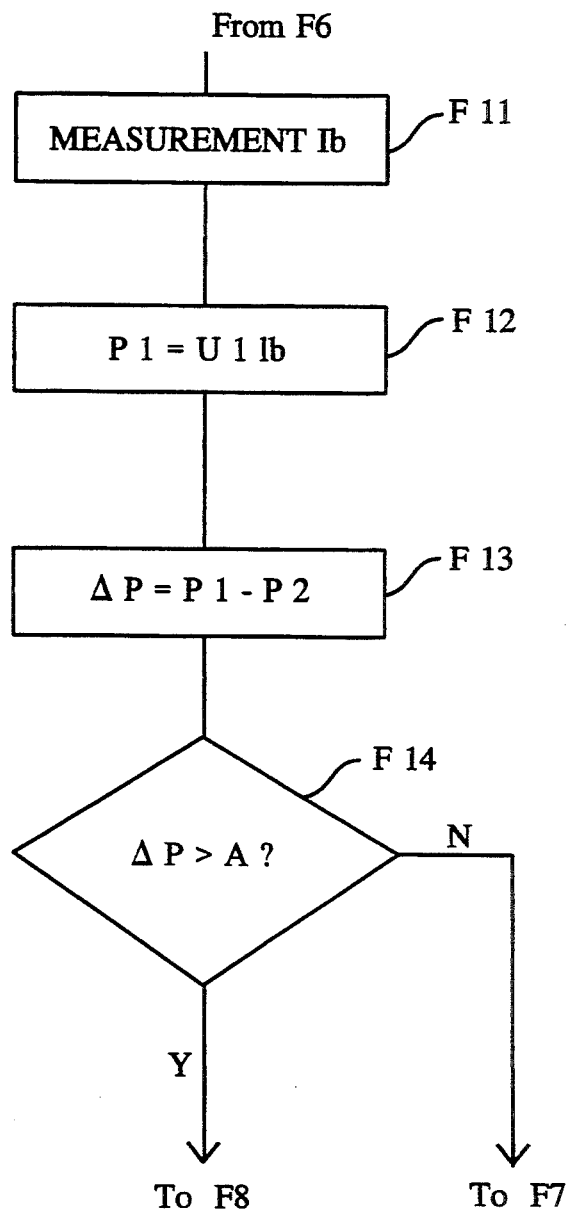
FIG. 5 illustrates an additional phase of a particular embodiment of the invention.

In the event of a large modification of the power delivered by the battery, computation of the second derivative can lead to spurious indications of failure. It is therefore preferable to inhibit indication in such a case. An additional inhibition phase, as represented in FIG. 5, can be inserted in the flow chart in FIG. 2, for example after phase F5 or F6. This inhibition phase consists in measuring (F11) the current Ib delivered by the battery, measured by a current sensor 10. Then the microprocessor computes (F12) the power delivered P1=UIb, and computes (F13) the difference $\Delta p$ between this power and the power measured in the previous measuring cycle. Then $\Delta p$ is compared (F14) with a preset threshold A. If $\Delta p$ is not greater than the threshold (output N of F14), the microprocessor continues normally according to the flow chart in FIG. 2 and goes on to phase F7. If on the other hand $\Delta p$ is greater than the threshold (output Y of F14), phases F7 and F10 are short-circuited and the microprocessor goes directly to phase F8, thus inhibiting any indication of failure. Phase F9 is then completed by storing P1 in P2 for the next cycle.

The detection device described above may be combined with a microprocessor-based device for determining the battery backup time. Indeed, a device of this kind determines the backup time of a battery from measurements of its voltage U and of the current Ib delivered by the battery and from computation of the power delivered. The existing flow chart then merely has to be completed by a computation of the second derivative and its comparison with a preset threshold to enable indication of failure of one or more battery cells to be achieved.

We claim:
1. A device for detecting failure of at least one battery cell of a battery comprising a plurality of cells connected in series, said device comprising:
   voltage measuring means for measuring the voltage at terminals of said battery during discharge of the battery;
   computing means, connected to said voltage measuring means, for computing a quantity representative of the second derivative of said voltage over time;
   comparing means, connected to said computing means, for comparing said quantity with a preset, positive or nil, threshold that is indicative of a change in sign of the second derivative; and
   failure indicating means, connected to said comparing means, for indicating said failure when said quantity is greater than said threshold.

2. The device according to claim 1, wherein the means for measuring the voltage comprise means for measuring the voltage at preset time intervals and means for storing three successive values of the voltage.

3. The device according to claim 2, wherein the means for computing the quantity representative of the second derivative comprise means for computing a quantity representative of the first derivative of the voltage.

4. The device according to claim 3, wherein the means for computing the quantity representative of the first derivative comprise means for computing the difference between two successive voltage values.

5. The device according to claim 4, wherein the means for computing the quantity representative of the second derivative comprise means for computing the difference between two successive values of the quantity representative of the first derivative.

6. The device according to claim 1, wherein the means for computing comprise a microprocessor.

7. A device for detecting failure of at least one battery cell of a battery comprising a plurality of cells connected in series, said device comprising:
   voltage measuring means for measuring the voltage at terminals of said battery during discharge of the battery;
   computing means, connected to said voltage measuring means, for computing a quantity representative of the second derivative of said voltage over time;
   comparing means, connected to said computing means, for comparing said quantity with a preset, positive or nil, threshold;
   failure indicating means, connected to said comparing means, for indicating said failure when said quantity is greater than said threshold;
   current measuring means for measuring discharge current of the battery;
   power computing means, connected to said voltage and current measuring means, for computing power delivered by the battery;
   storing means, connected to aid power computing means, for storing power delivered by the battery;
   difference computing means, connected to said power computing means and to aid storing means, for computing the power difference between two successive power values;
   means, connected to said difference computing means, for comparing said power difference with a preset power threshold; and
   inhibiting means for inhibiting said failure indicating means if said power difference is greater than said power threshold.

* * * * *